United States Patent [19]
Yam et al.

[11] Patent Number: 5,575,705
[45] Date of Patent: Nov. 19, 1996

[54] SLURRY BLASTING PROCESS

[75] Inventors: Benny S. Yam, Holmdel; Robert C. Jorgensen, Cherry Hill; William E. Spears, Jr., Lawrenceville, all of N.J.

[73] Assignee: Church & Dwight Co., Inc., Princeton, N.J.

[21] Appl. No.: 370,801

[22] Filed: Jan. 10, 1995

Related U.S. Application Data

[63] Continuation-in-part of Ser. No. 105,406, Aug. 12, 1993, Pat. No. 5,384,990.

[51] Int. Cl.⁶ .................................................. B24B 1/00
[52] U.S. Cl. ...................... 451/39; 451/40; 451/60; 451/446; 134/7
[58] Field of Search ......................... 15/95; 134/7, 32; 451/36, 38, 39, 40, 60, 446

[56] References Cited

U.S. PATENT DOCUMENTS

| | | | |
|---|---|---|---|
| 844,046 | 2/1907 | Radell | 451/39 |
| 2,421,806 | 6/1947 | Perry | 451/39 |
| 3,484,995 | 12/1969 | Gordon | 451/39 |
| 4,333,771 | 6/1982 | Altenschopfer et al. | 134/7 |
| 4,648,992 | 3/1987 | Graf et al. | 540/124 |
| 4,729,770 | 3/1988 | Higgins . | |
| 4,771,580 | 9/1988 | Male | 451/102 |
| 4,781,855 | 11/1988 | Shaw et al. | 252/135 |
| 4,863,524 | 9/1989 | Komabashiri et al. | 134/22 |
| 4,886,615 | 12/1989 | Dehan | 252/90 |
| 5,160,547 | 11/1992 | Kirschner et al. | 134/7 |
| 5,195,276 | 3/1993 | Vennerholm | 451/39 |
| 5,325,639 | 7/1994 | Kuboyama et al. | 451/39 |
| 5,375,378 | 12/1994 | Rooney | 451/38 |
| 5,407,378 | 4/1995 | Shank, Jr. | 451/38 |

FOREIGN PATENT DOCUMENTS 1491682 11/1987 U.S.S.R. .

Primary Examiner—Timothy V. Eley
Attorney, Agent, or Firm—Irving M. Fishman

[57] ABSTRACT

An improved slurry blasting process is disclosed wherein a liquid carrier medium such as water contains a dispersed water-soluble particulate abrasive to enhance blast cleaning efficiency and wherein the liquid carrier comprises a saturated solution such as the dissolved particulate abrasive so as to minimize the dissolution of the particulate abrasive therein. Slurry blasting at relatively low pressures below 500 psi and at room temperature provides effective and cost efficient cleaning of substrates. The slurry can be recovered and continuously reused. A recrystallization agent can be added to the slurry to increase abrasive particulate growth in the saturated solution.

31 Claims, 1 Drawing Sheet

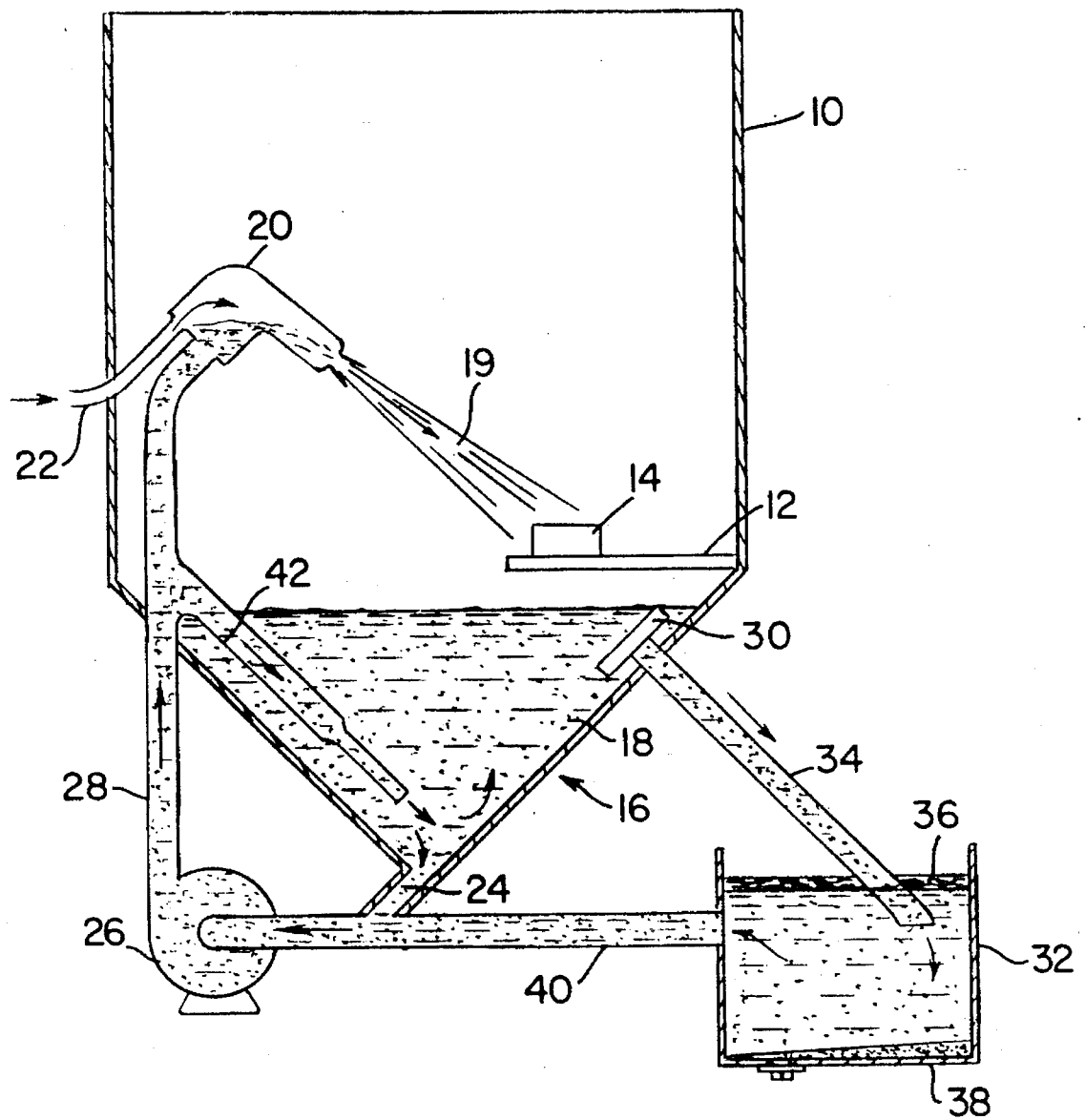

SLURRY BLASTING PROCESS

This application is a continuation-in-part of U.S. Ser. No. 105,406, filed Aug. 12, 1993 now U.S. Pat. No. 5,384,990.

FIELD OF THE INVENTION

The present invention relates to improvements in wet blasting to remove adherent materials such as paint, scale, dirt, grease and the like from solid surfaces. In particular, the present invention is concerned with cleaning a solid surface by directing against the solid surface a slurry of water soluble abrasive particles in water.

DESCRIPTION OF THE PRIOR ART

In order to clean a solid surface to preserve metal against deterioration, remove graffiti from stone or simply to degrease or remove dirt or other coatings from a solid surface, it has become common practice to use an abrasive blasting technique wherein abrasive particles are propelled by a fluid against the solid surface in order to dislodge previously applied coatings, scale, dirt, grease or other contaminants. Such abrasive blasting has been used favorably, for example, to degrease metal and has replaced the environmentally unsafe solvent treatments.

Various abrasive blasting techniques have been used to clean a surface including dry blasting which involves directing the abrasive particles to the surface by means of pressurized air typically ranging from 20 to 150 psi, wet blasting in which the abrasive blast media is directed to the surface by a pressurized stream of water typically 500 psi and above, and a process in which both air and water are utilized either in combination at high pressures to propel the abrasive blast media to the surface as disclosed in U.S. Pat. No. 4,817,342, or in combination in which relatively low pressure water is used primarily as a dust control agent or to control substrate damage.

The blast media or abrasive particles most widely used for blasting surfaces either by dry or wet blasting to remove adherent material therefrom is sand. Sand is a hard abrasive which is very useful in removing adherent materials such as paint, scale and other materials from metal surfaces such as steel. While sand is a most useful abrasive for each type of blasting technique, there are disadvantages in using sand as a blast media. For one, sand, i.e., crystalline silica, is friable and upon hitting a metal surface will break into minute particles which are small enough to enter the lungs. These minute silica particles pose a substantial health hazard. Additionally, much effort is needed to remove the sand from the surrounding area after completion of blasting. Still another disadvantage is the hardness of sand itself. Thus, sand cannot readily be used as an abrasive to remove coatings from relatively soft metals such as aluminum, or non-metallic substrates such as plastic, plastic composite structures, concrete or wood, as such relatively soft substrates can be excessively damaged by the abrasiveness of sand. Moreover, sand cannot be used around moving parts of machinery inasmuch as the sand particles can enter bearing surfaces and the like.

An alternative to sand as a blast media, particularly, for removing adherent coatings from relatively soft substrates such as softer metals as aluminum, composite surfaces, plastics, ceramic tile, concrete and the like is sodium bicarbonate. While sodium bicarbonate is softer than sand, it is sufficiently hard to remove coatings from metal surfaces and as well remove coatings including paint, dirt, and grease from non-metallic surfaces without harming the substrate surface. Sodium bicarbonate is not harmful to the environment and is most advantageously water soluble such that the particles which remain subsequent to blasting can be simply washed away without yielding environmental harm. Since sodium bicarbonate is water soluble and is benign to the environment, this particular blast media has found increasing use in removing coatings and cleaning dirt, grease and oil and the like from hard surfaces such as steel and interior surfaces such as those which contact food such as in environments of food processing or handling.

Sodium bicarbonate is also a friable abrasive and, like sand, will form a considerable amount of dust during the blast cleaning process. To control the dust formed by the sodium bicarbonate blast media as it contacts the targeted surface, water has been included in the compressed air carrier medium either internally of the nozzle or directed as an external stream onto the targeted abrasive particles.

Wet blasting to remove coatings and other contaminants from solid surfaces using a water stream either alone, or preferably, in conjunction with an abrasive blast media has advantages of economy over utilizing a dry blasting technique in which compressed air is used as the carrier for the blast media from the nozzle structure to the targeted surface. It is relatively easy to pump the water carrier to the pressures utilized in the wet blasting technique. On the other hand, the compression equipment needed to compress air to even the modest pressures utilized in the dry blasting technique is quite expensive.

The most commonly used wet blasting streams comprise either water alone or water into which has been introduced a quantity of sand, both water and sand being cheap and readily available. As stated above, sand cannot be readily used as an abrasive media when working with relatively soft substrates or in the interior of structures, in particular, where machinery is being utilized. Thus, it would be most worthwhile to use a water soluble abrasive blast media with the water stream to accelerate the particles through the blast nozzle and treat softer substrates and/or avoid the costly clean-up expenses inherent upon using hard, water insoluble abrasives such as sand.

For the soluble abrasive material to remain sufficiently abrasive at the work surface, it is necessary to minimize the dissolution of the abrasive particles in the carrier liquid. To minimize the dissolution of the water soluble abrasive particles in a wet blasting process, U.S. Pat. No. 4,125,969 suggests minimizing the amount of intermixing of the soluble abrasive material and the carrier liquid, and also minimize, or avoid entirely, contact of the abrasive material with other surfaces between the blast nozzle means and the work surface. Thus, in accordance with this patent, wet blasting is achieved by supplying the particulate abrasive material in a substantially dry state through a central abrasive outlet in the nozzle means and expelling the carrier liquid at high pressure toward the work surface from a plurality of separate liquid outlets disposed radially outwardly of the central abrasive outlet, and applying the separate streams from the abrasive and nozzle outlets to the work surface. U.S. Pat. No. 4,125,969 also discloses using abrasive particles which are soluble per se in the carrier liquid or particles which are substantially insoluble per se in the carrier liquid but which break down into sub-particles partially or completely soluble in the carrier liquid. This latter property may be achieved by physical or chemical treatment of the particle surfaces of the soluble abrasive material. Sodium silicate, either alone or in admixture with common salt is suggested as a soluble abrasive. A further suitable soluble crystalline particulate material may, for example, be treated to encourage the decomposition of its surface, followed by baking the particles to a hard glazed outer surface to render them slower to start dissolving. Encapsulation of each particle of soluble abrasive material with a brittle or friable skin of an acceptable insoluble material may also be appropriate. The insoluble material may be one which may be dried or baked over each particle.

Various techniques are known for introducing the particulate abrasive into the water stream, for example, by introduction of a separate air stream which carries the particulate abrasive into the throat of a venturi-type blast nozzle through which the water carrier is passing, or by mixing the particulate abrasive/air stream exterior of a blast nozzle means with the liquid-stream as disclosed in U.S. Pat. No. 4,125,969. For convenience of operation, the particulate abrasive and water have conventionally being allowed to mix while traveling through the interior of the blast nozzle which is used to direct the abrasive/water mixture to the work surface at high velocity.

Modifying the water soluble abrasive particles such as by applying a coating or some type of water insoluble skin to the particles to reduce dissolution of the particles in the water carrier prior to contact with the substrate surface adds additional expense to the blasting process and also negates the good economy of operation available utilizing the wet blasting technique, in particular, when water is used as the carrier and accelerator stream for an abrasive particle media. Further modifications of the blast nozzle such as that disclosed in U.S. Pat. No. 4,125,969 also add costs to the blast cleaning process.

Accordingly, there is a need to improve the efficiency of the wet blasting process, in particular, when wet blasting is used with a particulate abrasive media dispersed within the liquid carrier stream.

Still further, there is needed a wet blasting process wherein a mixture of soluble abrasive particles dispersed within a liquid stream is directed to a target surface and wherein the integrity of the soluble abrasive particle during transport from the supply of abrasive particles to the blast nozzle apparatus and/or from the blast nozzle apparatus to the targeted surface can be maintained so as to retain the maximum cutting force of the particles and at the same time, take advantage of the soluble nature of the abrasive particles with respect to vastly reduced clean-up costs relative to such costs when insoluble abrasive blast media such as sand is used.

These unmet needs form the objectives of the present invention and are believed to be met by the novel wet blasting process of the present invention which is described hereinafter.

SUMMARY OF THE INVENTION

The present invention is directed to improvements in wet blasting processes for removing coatings or other contaminants from solid surfaces with a liquid stream into which liquid stream there is dispersed abrasive particles which are soluble in the liquid carrier. The objects of the invention are achieved by forming the liquid stream from a slurry comprised of soluble abrasive particles and a saturated liquid solution. The saturated solution used to form the slurry insures that the particulate abrasive will not readily dissolve prior to contact with the targeted surface and that such particles will substantially retain the original geometry and the inherent abrading efficiency thereof. The slurry of saturated solution and abrasive particles can be formed in the blast nozzle apparatus from separate streams of saturated liquid carrier and abrasive particles or the slurry can be formed prior to entering the blast nozzle. In the latter instance, the abrasive particles can be added to the carrier stream or the slurry can be formed and then pumped to necessary pressure for passage through the nozzle. Advantageously, the slurry of saturated solution and abrasive particles can be collected and reused for additional blast cleaning. Moreover, the slurry can be manipulated to maintain or enhance crystal growth of used abrasive particles contained in the saturated solution.

BRIEF DESCRIPTION OF THE DRAWINGS

The FIGURE is a schematic of a slurry blasting process in which the slurry is recycled.

DETAILED DESCRIPTION OF THE INVENTION

The abrasive particles to be utilized and dispersed within the liquid stream for wet blasting are preferably water soluble and used with a liquid stream comprising water. The abrasive typically will be in the form of a powder having an average size range of from about 10 to 1,000 microns in diameter. Preferably, the abrasive particles will have an initial average size of from about 50–500 microns. Upon recycle and reuse, the particles will preferably have a size of at least about 15 microns. Water soluble abrasive particles are advantageous since such blast media can be readily rinsed off the cleaned surface, can be readily disposed of by a water stream, are readily separated from the insoluble paints and resins which have been stripped to facilitate waste disposal, and since most water soluble blast media are relatively soft, i.e., Mohs hardness less than 4.0, such media can be utilized to remove coatings, grease, dirt and the like from a variety of substrates including hard metals such as steel and, importantly, relatively soft metals such as aluminum as well as plastic, ceramic, concrete, wood and composites of such materials. Water soluble blast media having a Mohs hardness of less than 5.0 are generally useful in this invention, in particular, for cleaning softer substrates. Although not preferred, the abrasive particles may include insoluble abrasives such as sand, alumina, glass beads, steel shot, calcium carbonate, etc. to improve efficacy of cleaning, especially if the object to be cleaned is grossly contaminated and if the surface is hard enough to withstand the blast cleaning process using the harder abrasives. If used, the insoluble abrasives can be present in amounts of 1 to 50 wt. % relative to the total abrasive used.

Non-limiting examples of water soluble blast media which can be utilized include the alkali metal and alkaline earth metal salts such as the chlorides, chlorates, carbonates, bicarbonates, sesquicarbonates, sulfates, silicates, the hydrates of the above, etc. The preferred abrasive particles are alkali metal salts and, in particular, sodium and potassium carbonates, bicarbonates and sulfates. The most preferred blast media to be incorporated into the water stream are the alkali metal bicarbonates as exemplified by sodium bicarbonate. Such a blast media is marketed under the tradename Armex® by Church & Dwight Co., Inc., Princeton, N.J. Also preferably useful are sodium sesquicarbonate, natural sodium sesquicarbonate known as trona, sodium bicarbonate, sodium carbonate, potassium carbonate, potassium bicarbonate, sodium chloride and sodium sulfate which latter sodium salt is described in commonly assigned U.S.

Pat. No. 5,112,406. It is important to note that by water soluble is not meant completely water soluble as some salts and natural minerals such as trona may contain minor amounts of insoluble materials. For example, trona which is a natural sodium sesquicarbonate may contain up to 10 wt. % of insolubles. Thus, by water soluble is meant to include those materials which are substantially soluble in water.

In accordance with the present invention, any of the liquid streams which carry the abrasive particles can comprise a saturated solution. Preferably, the saturated solution is formed from dissolved abrasive media. The saturated solution forming the liquid carrier insures that the abrasive particles which are added to the carrier liquid to enhance the abrasive nature thereof do not readily dissolve and retain the geometry and abrasive nature thereof during the blast cleaning process. Thus, all of the liquid streams which contain the abrasive particles should comprise saturated solutions including any liquid stream which carries the abrasive particles from the source of supply to the primary particle accelerator stream as well as the liquid accelerator stream which is mixed prior to the nozzle with the particulate abrasive or directed separately to the nozzle and mixed with abrasive particles at the nozzle prior to being directed to the targeted surface. If the liquid accelerator stream is provided separately to the blast nozzle, the abrasive particles can be added to this liquid stream by aspiration, by means of compressed air or by admixture in a slurry in which the liquid carrier for the supply of abrasive particles is also a saturated solution so as to minimize dissolution of the abrasive particles from the supply source. Preferably, the abrasive particles are mixed with a saturated solution prior to the nozzle and this slurry is pumped to sufficient pressure such as by a piston driven positive displacement pump to the nozzle apparatus and subsequently to the targeted surface.

The liquid accelerator stream is preferably water although other liquids can be utilized. For example, glycerin has been utilized as a carrier fluid in blasting operations and is useful since it tends to maintain an even distribution of the particulates therein relative to water in which the particulates tend to settle out. Other water soluble polymeric materials can be used as the carrier liquid or, preferably, as an additive to water to affect the viscosity, specific gravity or surface tension thereof. These water soluble polymers are typically marketed as dust control additives. However, in view of the ease of use, expense with respect to the blast cleaning process and the clean-up of the spent media, water is preferred as the liquid carrier. With water as a carrier, the water soluble abrasive media described above can be used. For example, saturated solutions of sodium bicarbonate and water will comprise from about 7 to about 20% of the sodium bicarbonate depending upon the temperature of the water stream. If sodium carbonate or potassium carbonate are utilized as the blast media, substantially higher levels of these materials must be dissolved in the water stream to obtain a saturated solution. The relative dissolution of the abrasive media described above or other materials in water are readily obtainable from published literature. The water stream can alternatively be saturated with dissolved media other than the abrasive added to form the slurry. Thus, any soluble salt such as alkaline salts other than the abrasive can be added to the water carrier to form a saturated solution.

Once the liquid carrier stream or streams are saturated with the dissolved abrasive media or other salts, the abrasive media particles can be added therein to form a slurry with minimal dissolution of the added particles. The abrasive particles can be added by gravity as from a hopper, or carried to the saturated solution either by a compressed air stream or by admixture in a second saturated solution. The slurry is preferably formed prior to the blast nozzle as described above and pumped to the pressure required for blast cleaning. Alternatively, separate streams of the saturated liquid carrier and abrasive particles can be directed to the blasting apparatus and mixed therein prior to discharge to the targeted surface. The method of mixing the abrasive particles into the liquid carrier is not a critical feature of the invention. What is critical is that the dissolution of the abrasive blast particles be minimized by adding the abrasive blast particles to a saturated solution such as a saturated solution formed of the blast media in the liquid carrier.

The blasting equipment used in the wet blasting process of the present invention can be any of the conventional blasting equipment presently used. Examples include the blasting apparatus disclosed in U.S. Pat. No. 4,817,342 and U.S. Pat. No. 4,125,969. Typically, the wet blasting equipment comprises a venturi nozzle in which the pressurized fluid is accelerated by passage through a restricting orifice and directed to the targeted surface through an expanding outlet section of the nozzle. Usually, the venturi nozzle is a hand held device, although, automatic operation may be useful in some situations.

Various types of specific equipment can be used including high pressure water blasting equipment such as "Aqua-Dyne® high pressure water jet blaster" and "Dyna-Grip" wet abrasive blast system from Aqua-Dyne Incorporated, Houston, Tex. and "Aqua-Miser" blasting equipment for Carolina Equipment and Supply Company, Inc., North Charleston, S.C. which is described in U.S. Pat. No. 5,220,935 herein incorporated by reference. The above mentioned blasting apparatus mix the abrasive particles entrained in a compressed air stream with a separate high pressure liquid stream. The liquid stream and particulate stream are mixed at the nozzle. Typically, such wet blasting equipment utilizes liquid pressures of at least about 500 psi and, more typically, greater than about 3,000 psi, even upward to about 40,000 psi.

Alternative equipment and processes can be used to add the abrasive to the liquid stream. For example, as previously stated, a slurry of the abrasive particles and saturated solution can be formed and pumped to the desired pressure prior to entering the blast nozzle. The slurry can also be pumped to an intermediate pressure and then directed to the venturi-type nozzle to increase pressure and velocity of the blast medium. Further alternatives include adding a slurry of abrasive and saturated solution to either a compressed air or pressurized water accelerator stream at the blast nozzle. As an example, the "Vapormatt" blast cleaning system from Kleiber and Schulz, Inc. Melville, N.Y., is a system wherein a slurry of insoluble abrasive in water is accelerated in a blast nozzle by compressed air. Such a system can be easily modified to form the slurry of a saturated aqueous solution and a water soluble abrasive as described above.

Instead of the high pressure Aqua-Dyne®, Aqua-Mixer and like blasting equipment described above, lower water pressure equipment are available and can be used to direct the slurry of water soluble abrasives and saturated aqueous solution of this invention to the targeted surface. Thus, it has been found that equipment for directing the slurry to the targeted surface at relatively low pressures below 500 psi and even below 125 psi are available or can be made and can effectively remove dirt, grease or any other contaminant contained on a solid surface. It is believed a system such as the "Vapormatt" cleaning system described above can be used at low slurry pressures. It has further been found that the presence of the abrasive in the slurry allows the blast cleaning to be accomplished effectively at low pressure and at relatively low temperatures such as room temperature. By contrast, currently available aqueous cleaning solutions such as for metal parts and the like require elevated temperatures approaching 190° F. to achieve effective cleaning. Thus, an alternative which allows the slurry to be blasted at low pressure and low temperature can be operated at reduced costs with respect to the specialized equipment needed for high pressure water blasting and over aqueous based cleaners which require high temperatures and consequently additional energy costs.

Other alternatives for directing the slurry of water soluble abrasive and saturated aqueous solution against a targeted surface are available and can be used in accordance with the present invention. For example, blast wheels can be used including the "Hydropulse" from Goff, Seminole, Okla. Any type of equipment which directs the slurry as a stream against a contaminated surface can be used in this invention.

The slurry blasting process of this invention, in general, and, in particular, at lower slurry pressures, e.g. below 500 psi, can be effectively operated in a blast cabinet in which the slurry falls back into the bottom of the cabinet and can be collected and continuously recycled to dramatically reduce the costs of the process. If the saturated solution is made from the abrasive material, maintenance of crystal size and even crystal growth of the abrasive can be achieved subsequent to contact with the target surface. Such a system is shown in the FIGURE.

As shown in the FIGURE, a blast cabinet 10 has contained therein a support 12 for supporting a part 14 to be cleaned within the cabinet. Although not shown, cabinet 10 can include conventional embodiments such as viewing ports and one or more doors to facilitate the placement and removal of the objects to be cleaned. The cabinet 10 has a bottom portion 16 capable of holding a slurry 18 comprised of particles of a water soluble abrasive in a saturated aqueous solution. Blast equipment of any conventional configuration such as nozzle 20 is utilized to direct the slurry 18 as a stream 19 against substrate 14. If desired, the slurry 18 can be assisted through blast nozzle 20 by compressed air supplied via compressed air line 22.

As can be seen from the FIGURE, the slurry which is directed against substrate 14 is allowed to fall back into the bottom 16 of cabinet 10. The used slurry can be recycled such as through passage 24 at the apex of conical bottom 16 via slurry pump 26 which directs the slurry 18 from the bottom 16 of cabinet 10 to blast nozzle apparatus 20 via line 28. Simultaneously, a portion of slurry 18 can be directed by automatic level valve 30 into settling/recrystallization tank 32 via line 34. Valve 30 is placed near the surface of the slurry 18 contained in cabinet 10 so as to maintain a desired level of slurry in cabinet 10. Along with the slurry, valve 30 also removes from cabinet 10 the contaminants which have been abraded or washed from substrate 14. In tank 32, any light oils 36 which are removed from the surface of substrate 14 can be skimmed from the surface of the slurry. Similarly, any heavy contaminants such as dirt and other heavy particles which settle and accumulate in the bottom of tank 32 as a sludge 38 can be drained from tank 32 by any conventional means.

Importantly, tank 32 can also act as a recrystallization vessel in which the spent abrasive particles contained in slurry 18 can be induced to grow prior to being recycled to the blast nozzle via line 40 and pump 26. Thus, abrasive particle crystal growth in the saturated solution of the media slurry can be induced in a variety of ways including reducing the temperature of settling tank 32 relative to the slurry contained in cabinet 10 or, if required, heating and then cooling. Heating the slurry dissolves more salt and, thus, provides more material in solution for eventual crystal growth. Alternatively, crystal growth of the abrasive particles can be enhanced in the slurry by the addition of recrystallization agents to the slurry.

Initially, the abrasive particles contained in slurry 18 have an average diameter of between 50 and 500 microns which is the preferable range. After contact with the substrate 14, the abrasive particles in the used slurry will be substantially broken down and have a diameter typically ranging between 5 and 50 microns. By maintaining the solution of slurry 18 as a saturated solution, there is some crystal growth believed to take place as the slurry sits within the bottom 16 of cabinet 10. By diverting a portion of slurry 18 into settling/recrystallization tank 32, recrystallization conditions can be advantageously isolated for tank 32 such as heating and cooling the slurry or by providing the addition of recrystallization agents to increase the particle size from 5–50 microns to about 20–150 microns and more depending upon residence time and recrystallization conditions in tank 32. By recycling and mixing the recrystallized slurry 18 from tank 32 with the slurry 18 in cabinet 10, the average diameter of the abrasive particles being directed against substrate 14 can be maintained at about 20 to 50 microns. It is believed possible to increase the average diameter of the abrasive in the recycled slurry up to about 100 microns and beyond depending upon recrystallization conditions and efforts. Although enhanced crystal growth has been described as operable in tank 32, it is also possible to add a recrystallizing agent directly to the slurry 18 in cabinet 10. Recrystallization agents which can be used are any of those known for use in water and include for example sodium hexametaphosphate and sodium polyacrylate.

New supplies of abrasive particles having an average diameter of 10 to 1,000 microns can be added to slurry 18 in cabinet 10 or added to the settling tank 32 to continuously renew the abrasive and maintain a relatively large average particle size of the abrasive in slurry 18. Obviously, the excessive addition of new abrasive negates the cost savings achieved by the ability to continuously recycle the abrasive in the form of the media slurry. Media slurry from settling tank 32 can be mixed with the slurry 18 in the bottom 16 of tank 18 via piping 42 which acts as an overflow for piping 28 directed to blast nozzle 20 and provides a mixing of the slurries from tank 32 and cabinet 10.

The slurry blasting process of this invention is not intended to be limited to the use thereof in a blast cabinet or even to the recycle and reuse of the spent slurry, although such uses are preferred. An alternative slurry blasting process in which the slurry can be reused is in the treatment of hollow articles. In such a scheme, a slurry contained in a supply tank or the like can be pumped and directed as a stream through hollow articles, such as pipes, tubes, etc. to remove contaminates from the interior surfaces thereof. If desired, this slurry can then be redirected to the supply tank for crystal growth and reused.

The process of this invention can also operate as a continuous process in which spent slurry is treated to remove or skim from the surface thereof the top layer of grease and oil and new slurry is continuously added to the active supply.

Since, the blast media of the present invention is in the form of a slurry comprising water soluble abrasive particles in a saturated aqueous solution, the aqueous solution can include other cleaning adjuvants which enhance the cleaning effect or post-treatment characteristics of the substrate.

For example, the blast media of the present invention can include at least one surfactant incorporated therein. The surfactant which may be utilized can be anionic, nonionic or amphoteric in nature or mixtures of the various types of surfactants can be used. The surfactant can be added to the abrasive particles or to the aqueous saturated solution. Commonly assigned, U.S. Pat. Nos. 5,316,587, issued May 31, 1994 and 5,332,447, issued Jul. 26, 1994, both incorporated herein by reference, describe the types of surfactants which can be added to a blast media.

The surfactants can be added merely to enhance removal of abrasive residues which remain on the target surface or can be added to enhance cleaning of the substrate by means of the detersive action of the surfactants. The amount of surfactant needed to provide reduced residue content and easily rinsed residues is extremely small in most cases and, thus, will range from about finite levels to about 3 wt. %, preferably about 0.05 to about 1 wt. %, and, more preferably, from about 0.05 to 0.5 wt. % of the abrasive blast media particles. At such levels the surfactant can be added to the abrasive particles by the methods set forth in the above-mentioned commonly assigned patents. Surfactant levels provided to aid in removing any dirt, grease or oil from the substrate can be much higher and, thus, range from about 0.1 to 30 wt % relative to the abrasive. At such levels, the surfactant can be added effectively in the aqueous phase of the slurry blast media. Nonionic surfactants appear to best provide the additional detersive action. It may be possible to provide several kinds of surfactants with the blast media including those most readily able to reduce residue formation such as anionic surfactants and nonionic surfactants most capable of enhancing the removal of dirt, grease or oil from the substrate. The surfactants added to the slurry also advantageously solubilize the dirt and grease allowing easier clean up and reduces the deflection of dirt from one surface to another. Antifoam agents can be added to minimize foam generated by the surfactants.

Further agents which enhance cleaning efficacy or provide a post-treatment to the target surface can be added to the slurry blast stream by direct addition to the slurry or added to the abrasive particles. For example, soluble alkaline salts can be added to the saturated solution to increase solution pH or act as builder salts to improve removal of soil, greases, oils, etc. from the substrate being cleaned. Such salts can include alkali metal carbonates, bicarbonates, the hydrates thereof, sesquicarbonates, ortho or complex phosphates such as pyrophosphate, tripolyphosphate as well as the alkali metal borates, acetates, citrates, tartrates, gluconates, succinates, silicates, phosphonates, nitrilotriacetates, edates, etc.

Corrosion inhibitors can be added to the saturated solution including alkali metal silicates, magnesium oxide as well as other anticorrosion metal salts and organic compounds such as benzotriazole, tolytriazole, etc. Alkali metal orthophosphates appear to be useful in reducing coloration of zinc-containing surfaces. Additives such as sanitizers, rust-proofing agents, fire retardants, etc. which beneficially treat the target surface subsequent to blast cleaning can be used in the solution of the slurry media.

The wet blasting process of the present invention as constituted from the water soluble abrasive particles and saturated liquid solutions as described above are useful for efficient cleaning or decoating of sensitive metals such as aluminum or aluminum alloys, magnesium, or composite substrates, such as utilized on exterior aircraft surfaces, masonry, stucco, plaster, wood or plastics. Stainless steel, and structual steel surfaces can also be cleaned.

The structure of the surface to be cleaned can vary widely and is unlimited. Thus, the surface can be a part of complex configuration, sheeting, coils, rolls, bars, rods, plates, discs, pipes, tubes, etc. Such articles can be derived from any source including for home use, industrial use such as from the aerospace industry, automotive industry, electronic industry, such as a circuit board, and the like, etc.

The type of contaminant which can be removed from the substrates using the process of this invention are unlimited. In general, the process of this invention can be used to remove all types of contaminants including greases, cutting fluids, drawn fluids, machine oils, anti-rust oils such as cosmolene, carbonaceous soils, sebaceous soils, particulate matter, waxes, paraffins, used motor oil, fuels, etc.

If circuit boards are to be cleaned in accordance with the process of this invention, contaminants such as rosin flux, aqueous-based flux, photoresist, solder masks, adhesives, machine oils, greases, silicones, lanoline, mold release agents, polyglycols and platisizers, etc. can be removed.

EXAMPLE I

A slurry blasting process was conducted in a wet blast cabinet which contained a slurry hopper in the bottom of the cabinet. Compressed air was used to agitate ARMEX® particles via several spray nozzles in the hopper. A diaphragm pump (installed at the top of the cabinet) delivered the slurry to a sand blasting nozzle at about 80 psi.

About 30 lbs of ARMEX® Maintenance Formula XL (sodium bicarbonate, 250–300 microns average diameter) with SupraKleen™ (rinsing agents) were added to about 13 gallons of water in the slurry hopper. This resulted in a slurry containing about 15% ARMEX® particles. Separately, about 20–40 gm. of an anti-foam agent were added to the slurry to minimize foam.

Several aluminum auto circuit covers contaminated with soils, grease and carbon deposits and one computer board were cleaned by the slurry blast at room temperature. Each piece was fully cleaned in about one minute.

The aluminum covers darkened very rapidly, in about a few seconds after cleaning. The darkening problem was minimized by rinsing the covers immediately after cleaning. To further minimize the darkening problem, 0.3% ARMEX® Aluminum Pacification System (corrsion inhibitor) was added to the slurry. The cover was blasted and then rinsed immediately. The darkening problem was significantly reduced.

Slurry samples were analyzed after 1, 4, and 8 hours of blasting. The particles in the slurry were found to have a median size of 20–30 microns. This result indicates that the particle size in the slurry probably reached an equilibrium, and that accordingly the slurry would have a long effective life.

The pH of the slurry was also measured. The pH was found to be in the range of 9.1–9.4. The pH of a freshly prepared ARMEX® solution is about 8.2. The increased pH of the slurry is expected because sodium bicarbonate slowly decomposes in water forming sodium carbonate, thus increasing the pH of the slurry. Since the pH did not increase beyond 9.4, it is likely that the ratio of sodium bicarbonate and carbonate in the slurry had reached an equilibrium.

EXAMPLE 2

A separate slurry trial was conducted in a wet blast cabinet by adding 25 lbs of ARMEX® Hydroflex™ Formula XL to about 8 gallons of water in the slurry hopper. About 40 gm. of an antifoaming agent was added to minimize foam.

The slurry was used to clean dirty carburetor parts using the following conditions: 4–5 gpm slurry flow rate, 80 psi slurry pressure, and 80 psi air pressure. Each part took about 2–5 minutes to clean. The cleaned part was first rinsed in a 25% vinegar solution and then rinsed in fresh water. The rinsed part was dried by blowing compressed air over it.

After cleaning 10, carburetor parts, 25 lbs of ARMEX® Hydroflex™ Formula XL and 40 gm. of the antifoam agent was added to the slurry hopper. The cleaning operation was resumed. Another 10 parts were cleaned, rinsed, and dried. This process was continued until a total of 150 lbs of ARMEX® Hydroflex™ Formula XL was added. At this point, the slurry became very viscous and dirty and was discarded.

What is claimed is:

1. A process for blast cleaning comprising; subjecting a work surface to a blast stream comprising a slurry of a carrier liquid and a particulate abrasive material which is soluble in said carrier liquid, said carrier liquid comprising a saturated solution of said soluble particulate abrasive so as to minimize dissolution of said particulate abrasive therein, said blast stream being directed to said work surface by means of a venturi nozzle wherein said blast stream is accelerated through a restricting orifice and subsequently through an expanding outlet section of said nozzle, said blast stream being formed prior to entering said venturi nozzle and directed through said nozzle by a pressurized air stream, said slurry being directed through said nozzle and at said work surface at a pressure of less than 500 psi.

2. The process of claim 1 wherein said carrier liquid is water and said particulate abrasive is water soluble.

3. The process of claim 2 wherein said water soluble particulate abrasive comprises alkali metal and alkaline earth metal salts.

4. The process of claim 3 wherein said particulate abrasive is selected from the water soluble alkali metal and alkaline earth metal chlorides, chlorates, carbonates, bicarbonates, sesquicarbonates, sulfates, silicates and the hydrates thereof.

5. The process of claim 4 wherein said particulate abrasive comprises the alkali metal carbonates or bicarbonates.

6. The process of claim 5 wherein said particulate abrasive comprises sodium bicarbonate.

7. The process of claim 2 wherein said saturated solution comprises dissolved water soluble material in water wherein said dissolved soluble material comprises at least a portion of material other than said abrasive material.

8. The process of claim 2 wherein said carrier liquid contains an adjuvant other than said particulate abrasive material to aid in the removal of contaminants from said work surface or to provide a post-treatment characteristic to said work surface.

9. The process of claim 8 wherein said adjuvant is at least one surfactant.

10. The process of claim 8 wherein said adjuvant comprises alkaline builder salts.

11. The process of 8 wherein said adjuvant comprises an anti-corrosion agent.

12. The process of claim 11 wherein said anticorrosion agent is an orthophosphate and said work surface contains zinc.

13. The process of claim 1 wherein said slurry is pressurized to less than 125 psi.

14. The process of claim 1 wherein subsequent to contact of said blast stream with said work surface, recovering at least a portion of said slurry and recycling at least a portion of said slurry to said blast stream.

15. The process of claim 14 wherein said carrier liquid is water and said particulate abrasive is water soluble.

16. The process of claim 15 wherein said particulate abrasive comprises alkali metal cabonates or bicarbonates.

17. The process of claim 16 wherein said particulate abrasive comprises sodium bicarbonate.

18. The process of claim 14 wherein said recovered slurry is treated to increase the crystal growth of said particulate abrasive material in said slurry.

19. The process of claim 18 wherein said crystal growth treatment comprises the addition of a recrystallization agent to said recovered slurry.

20. The process of claim 1 wherein said work surface comprises the interior of a hollow article.

21. The process of claim 20 wherein said hollow article comprises an open-ended pipe in which the blast stream is directed onto the interior surfaces of said pipe.

22. The process of claim 21 wherein subsequent to contact of the blast stream with the interior surface of said pipe, recovering at least a portion of said slurry and recycling at least a portion of said slurry to said blast stream.

23. A process for blast cleaning comprising; subjecting a work surface to a blast stream comprising a slurry of a carrier liquid and a particulate abrasive material which is soluble in said carrier liquid, said carrier liquid comprising a saturated solution of said soluble particulate material so as to minimize dissolution of said particulate abrasive therein, subsequent to contact of said blast stream with said work surface, recovering at least a portion of said slurry, treating said recovered slurry to increase the crystal growth of said particulate abrasive material in said slurry and recycling at least a portion of said slurry to said blast stream.

24. The process of claim 23 wherein said carrier liquid is water and said particulate abrasive is water-soluble.

25. The process of claim 24 wherein said water-soluble particulate abrasive comprises alkali metal and alkaline earth metal salts.

26. The process of claim 25 wherein said particulate abrasive comprises sodium bicarbonate.

27. The process of claim 24 wherein said carrier liquid contains an adjuvant other than said particulate abrasive material to aid in the removal of contaminants from said work surface or to provide a post treatment characteristic to said work surface.

28. The process of claim 27 wherein said adjuvant is at least one surfactant.

29. The process of claim 27 wherein said adjuvant comprises alkaline builder salts.

30. The process of claim 27 wherein said adjuvant comprises an anti-corrosion agent.

31. The process of claim 23 wherein said crystal growth treatment comprises the addition of a recrystallization agent to said recovered slurry.

* * * * *